(12) United States Patent
Luo

(10) Patent No.: US 7,030,801 B2
(45) Date of Patent: Apr. 18, 2006

(54) DEVICE AND METHOD FOR LOW NON-LINEARITY ANALOG-TO-DIGITAL CONVERTER

(75) Inventor: Wenzhe Luo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 10/808,721

(22) Filed: Mar. 24, 2004

(65) Prior Publication Data

US 2005/0206546 A1    Sep. 22, 2005

(30) Foreign Application Priority Data

Mar. 15, 2004   (CN) ............................ 200410017099

(51) Int. Cl.
*H03M 1/12*        (2006.01)

(52) U.S. Cl. ........................................ 341/155; 341/172
(58) Field of Classification Search ................ 341/155, 341/163, 172
See application file for complete search history.

(56) References Cited

U.S. PATENT DOCUMENTS

| 4,200,863 A | * | 4/1980 | Hodges et al. ............... 341/156 |
| 4,369,433 A | * | 1/1983 | Yamakido .................... 341/150 |
| 4,517,549 A | * | 5/1985 | Tsukakoshi .................. 341/156 |
| 4,668,936 A | * | 5/1987 | Newcomb et al. ........... 341/172 |
| 5,258,761 A | * | 11/1993 | Fotouhi et al. .............. 341/172 |
| 5,416,485 A | * | 5/1995 | Lee .............................. 341/172 |

* cited by examiner

*Primary Examiner*—Peguy JeanPierre
(74) *Attorney, Agent, or Firm*—Townsend and Townsend and Crew LLP

(57) ABSTRACT

An apparatus and method for converting an analog signal to a digital signal. The apparatus includes a plurality of capacitors. The plurality of capacitors includes at least a first capacitor, a second capacitor and a third capacitor. The first capacitor is associated with a first capacitance, a second capacitor is associated with a second capacitance, and a third capacitor is associated with a third capacitance. The first capacitance is substantially equal to the second capacitance, and the second capacitance is substantially equal to the third capacitance. Additionally, the apparatus includes a plurality of resistors. The plurality of resistors includes at least a first resistor and a second resistor. Moreover, the apparatus includes an operational amplifier.

20 Claims, 3 Drawing Sheets

DEVICE AND METHOD FOR LOW NON-LINEARITY ANALOG-TO-DIGITAL CONVERTER

CROSS-REFERENCES TO RELATED APPLICATIONS

This application claims priority to Chinese Patent Application No. 200410017099.2, filed Mar. 15, 2004, entitled "Device and Method for Low Non-Linearity Analog-To-Digital Converter," by Inventor Wenzhe Luo, commonly assigned, incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits. More particularly, the invention provides a device and method for low non-linearity analog-to-digital converter. Merely by way of example, the invention has been applied to a successive approximation register (SAR) analog-to-digital converter (ADC). But it would be recognized that the invention has a much broader range of applicability.

The successive approximation register (SAR) analog-to-digital converter (ADC) is widely used for analog-to-digital conversion. The analog-to-digital conversion uses a binary search to digitize an analog signal to a digital signal. The analog signal generates an analog voltage which is compared to an effective reference voltage generated by the SAR ADC. The SAR ADC uses a resistor string or/and a capacitor array to generate the effective reference voltage. Based on comparison between the analog voltage and the effective reference voltage, the effective reference voltage is adjusted and again compared with the analog voltage. Through iterations, the binary search narrows down the digital range until the bit length is reached.

FIG. 1 is a simplified diagram for SAR ADC. A SAR ADC 100 uses both a capacitor array and a resistor string to generate an effective reference voltage. The capacitor array is used for 3 Most Significant Bits (MSBs), and the resistor string is used for 3 Least Significant Bits (LSBs). The resistor string can be connected only to a capacitor 116, and the voltage on the capacitor 116 can be multiples of ⅛ of a reference voltage ($V_{ref}$) 130. An input analog voltage ($V_{in}$) 140 is sampled at the bottom of capacitors 110, 112, 114 and 116 with an op-amp 120 closed. Then the op-amp 120 is opened and one of voltages 132, 134 and 136 is applied to each of the capacitors 110, 112, 114 and 116. The voltage 136 is at the ground level. The effective capacitance connected to $V_s$ is decided by a SAR-controlled process and includes the effective capacitance of the capacitor 116. The effective capacitance of the capacitor 116 equals the capacitance of the capacitor 116 multiplied by m/8 when a switch (150+2m) is closed. The effective reference voltage equals $V_{ref}$ multiplied by the ratio of effective capacitance to total capacitance. The total capacitance is the sum of capacitance for the capacitors 110, 112, 114 and 116.

As shown in FIG. 1, the capacitors 114 and 116 are designed to have the same capacitance. The capacitor 110 should have four times of capacitance as the capacitor 114 or 116, and the capacitor 112 should have twice as much as capacitance as the capacitor 114 or 116. Additionally, resistors 170, 172, 174, 176, 178, 180, 182, and 184 should have the same resistance. These design specifications may not be fully implemented in a fabricated SAR ADC. For example, the fabricated SAR ADC may have slightly different capacitance for the capacitors 114 and 116. These mismatches of individual resistors or capacitors can adversely affect the linearity of the SAR ADC and quality of the analog-to-digital conversion.

From the above, it is seen that an improved technique for analog-to-digital conversion is desired.

BRIEF SUMMARY OF THE INVENTION

The present invention is directed to integrated circuits. More particularly, the invention provides a device and method for low non-linearity analog-to-digital converter. Merely by way of example, the invention has been applied to a successive approximation register (SAR) analog-to-digital converter (ADC). But it would be recognized that the invention has a much broader range of applicability.

In a specific embodiment, the invention provides an apparatus for converting an analog signal to a digital signal. The apparatus includes a plurality of capacitors. The plurality of capacitors includes at least a first capacitor, a second capacitor and a third capacitor. The first capacitor is associated with a first capacitance, a second capacitor is associated with a second capacitance, and a third capacitor is associated with a third capacitance. The first capacitance is substantially equal to the second capacitance, and the second capacitance is substantially equal to the third capacitance. Additionally, the apparatus includes a plurality of resistors. The plurality of resistors includes at least a first resistor and a second resistor. The first resistor is associated with a first resistance, and a second resistor is associated with a second resistance. The first resistance is substantially equal to the second resistance. Moreover, the apparatus includes an operational amplifier. The optional amplifier includes at least a first input terminal, a second input terminal and an output terminal. The first capacitor includes a first capacitor terminal and a second capacitor terminal, the second capacitor includes a third capacitor terminal and a fourth capacitor terminal, and the third capacitor includes a fifth capacitor terminal and a sixth capacitor terminal. The first capacitor terminal, the third capacitor terminal, and the fifth capacitor terminal are coupled to the first input terminal. The second input terminal is coupled to a first voltage. Each of the second capacitor terminal, the fourth capacitor terminal, and the sixth capacitor terminal is capable of being coupled to anyone of the first voltage, an analog voltage, a second voltage, and a third voltage. The analog voltage is associated with the analog signal. The first resistor includes a first resistor terminal and a second resistor terminal, and the second resistor includes a third resistor terminal and a fourth resistor terminal. The first resistor terminal is coupled to the second voltage, the fourth resistor terminal is coupled to the first voltage, and the first resistor and the second resistor are in series. The third voltage is capable of being coupled to anyone of at least the first resistor terminal, the second resistor terminal, and the third resistor terminal. The apparatus is configured to convert the analog signal to the digital signal and is associated with a process related to a successive approximation register. The process includes processing information associated with the analog voltage and a fourth voltage; adjusting the fourth voltage in response to information associated with the analog voltage and the fourth voltage, and determining the digital signal based on at least information associated with the fourth voltage. The fourth voltage is associated with at least a first voltage level of the second capacitor terminal, a second voltage level of the fourth capacitor terminal and a third voltage level of the sixth capacitor terminal. The first voltage level, the second voltage level and the third voltage level each is selected from a group consisting of the first voltage, the second voltage and the third voltage.

According to another embodiment of the present invention, an apparatus for converting an analog signal to a digital signal includes a plurality of capacitors. The plurality of capacitors includes at least a first capacitor and a second capacitor. The first capacitor is associated with a first capacitance, a second capacitor is associated with a second capacitance, and the first capacitance is substantially equal to the second capacitance. Additionally, the apparatus includes a plurality of resistors. The plurality of resistors includes at least a first resistor and a second resistor. The first resistor is associated with a first resistance, a second resistor is associated with a second resistance, and the first resistance is substantially equal to the second resistance. Moreover, the apparatus includes an operational amplifier. The operational amplifier includes at least a first input terminal, a second input terminal and an output terminal. The first capacitor includes a first capacitor terminal and a second capacitor terminal, the second capacitor includes a third capacitor terminal and a fourth capacitor terminal, and the first capacitor terminal and the third capacitor terminal are coupled to the first input terminal. The second input terminal is coupled to a first voltage. Each of the second capacitor terminal and the fourth capacitor terminal is capable of being coupled to anyone of the first voltage, an analog voltage, a second voltage, and a third voltage. The analog voltage is associated with the analog signal. The first resistor includes a first resistor terminal and a second resistor terminal. The second resistor includes a third resistor terminal and a fourth resistor terminal. The first resistor terminal is coupled to the second voltage, the fourth resistor terminal is coupled to the first voltage, and the first resistor and the second resistor are in series. The third voltage is capable of being coupled to anyone of at least the first resistor terminal, the second resistor terminal, and the third resistor terminal. The apparatus is configured to convert the analog signal to the digital signal and is associated with a process related to a successive approximation register. The process includes coupling the second capacitor terminal and the fourth capacitor terminal to the analog voltage, processing information associated with the analog voltage and a fourth voltage; adjusting the fourth voltage in response to information associated with the analog voltage and the fourth voltage, and determining the digital signal based on at least information associated with the fourth voltage. The fourth voltage is associated with at least a first voltage level of the second capacitor terminal and a second voltage level of the fourth capacitor terminal. The first voltage level and the second voltage level each is selected from a group consisting of the first voltage, the second voltage and the third voltage.

According to yet another embodiment of the present invention, a method for converting an analog signal to a digital signal includes providing an apparatus for converting the analog signal to the digital signal. The apparatus includes a plurality of capacitors associated with a plurality of capacitances. Each of the plurality of capacitances is substantially equal. Additionally, the apparatus includes a plurality of resistors in series and associated with a plurality of resistances. Each of the plurality of resistances is substantially equal. The plurality of capacitors is associated with a first plurality of capacitor terminals and a second plurality of capacitor terminals. The first plurality of capacitor terminals is coupled to each other, and each of the second plurality of capacitor terminals is capable of being coupled to anyone of a first voltage, an analog voltage, a second voltage, and a third voltage. The analog voltage is associated with the analog signal. The plurality of resistors is associated with a plurality of resistor terminals. A first terminal of the plurality of resistor terminals is coupled to the second voltage, and a second terminal of the plurality of resistor terminals is coupled to the first voltage. The third voltage is capable of being coupled to at least anyone of the plurality of resistor terminals free from the second terminal. Additionally, the method includes coupling each of the second plurality of capacitor terminals to the analog voltage, decoupling each of the second plurality of capacitor terminals from the analog voltage, and coupling each of the second plurality of capacitor terminals to one selected from a group consisting of the first voltage, the second voltage, and the third voltage. The second plurality of capacitor terminals is associated with a plurality of capacitor voltage levels respectively. Moreover, the method includes processing information associated with the analog voltage and a fourth voltage. The fourth voltage is associated with the plurality of capacitor voltage levels. Additionally, the method includes adjusting the fourth voltage in response to information associated with the analog voltage and the fourth voltage and determining the digital signal based on at least information associated with the fourth voltage.

Many benefits are achieved by way of the present invention over conventional techniques. Certain embodiments of the present invention significantly improve differential non-linearity and monotonicity of output digital codes for an analog-digital converter. Some embodiments of the present invention limit the increase or decrease of the effective capacitor with a change of one Least Significant Bit (LSB). Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a device and method for low non-linearity analog-to-digital converter.

Merely by way of example, the invention has been applied to a successive approximation register (SAR) analog-to-digital converter (ADC). But it would be recognized that the invention has a much broader range of applicability.

Figure 1:
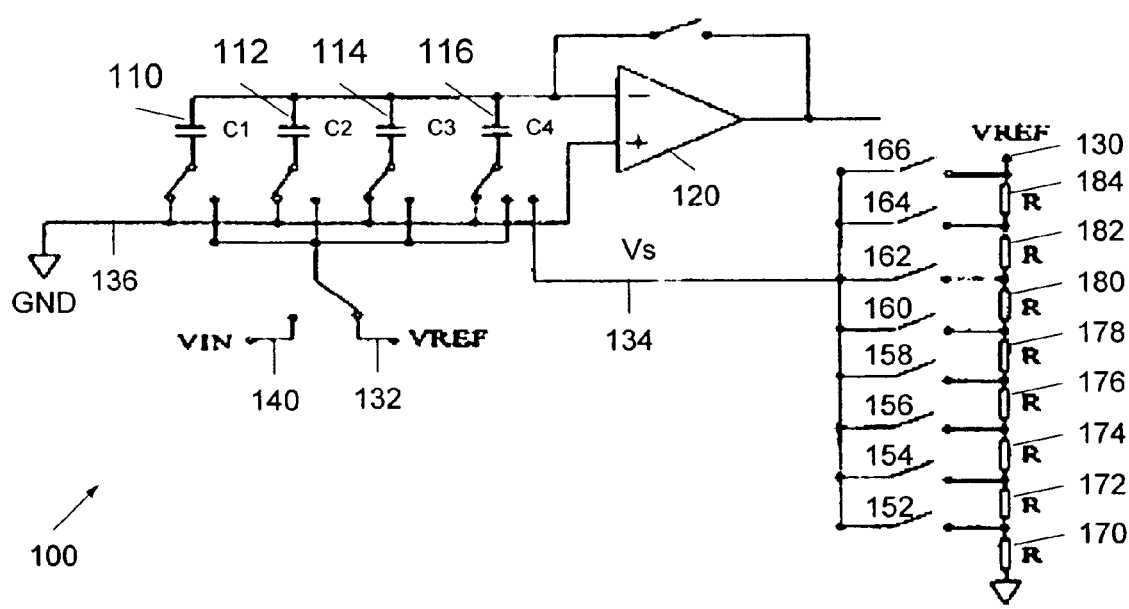
FIG. 1 is a simplified diagram for SAR ADC.

As shown in FIG. 1, the capacitors 110, 112, 114 and 116 have capacitance $C_1$, $C_2$, $C_3$ and $C_4$ respectively. $C_1$ should equal $4C_4$, $C_2$ should equal $2C_4$, and $C_3$ should equal $C_4$. Hence $C_2$ should equal $C_3+C_4$. For example, for a digitized voltage 101111, the effective capacitance $C_x$ should equal to $C_1+C_3+7C_4/8$. Similarly, for a digitized voltage 110000, the effective capacitance $C_x$ should equal $C_1+C_2$. In the fabricated SAR ADC, $C_2$ may not equal $C_3+C_4$. This mismatch can create differential non-linearity for SAR ADC.

Figure 2:
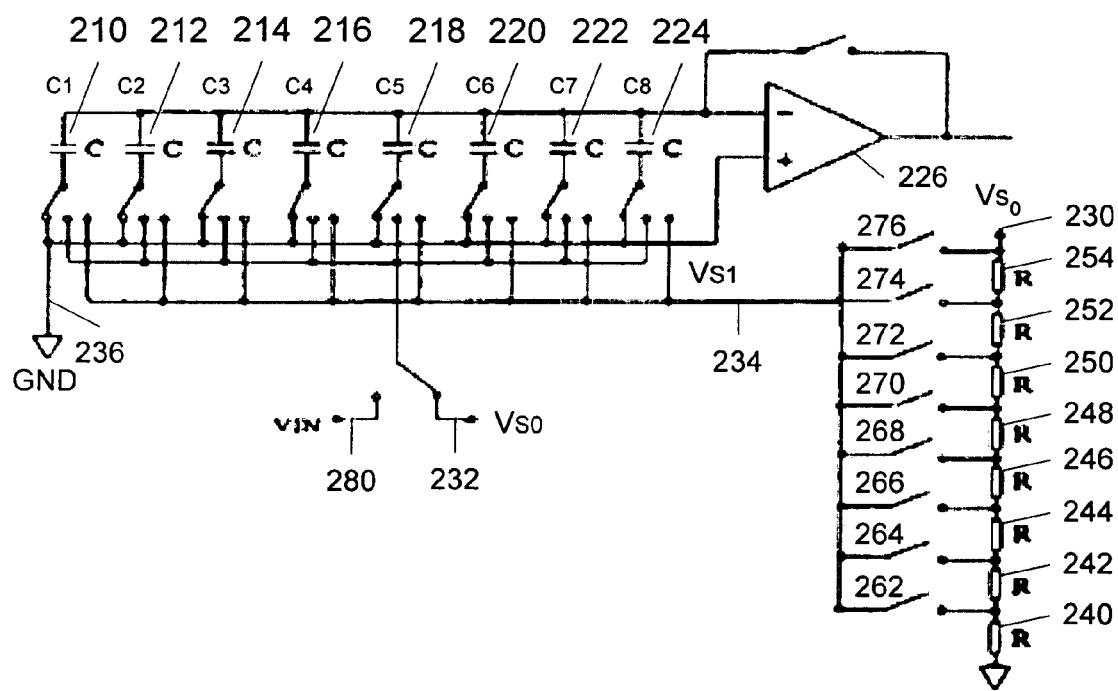
FIG. 2 is a simplified diagram for an analog-to-digital converter according to an embodiment of the present invention.

FIG. 2 is a simplified diagram for an analog-to-digital converter according to an embodiment of the present invention. This diagram is merely an example, which should not unduly limit the scope of the claims herein. The device 200 includes the following components:
 1. Capacitors 210, 212, 214, 216, 218, 220, 222 and 224;
 2. Op-amp 226;
 3. Resistors 240, 242, 244, 246, 248, 250, 252 and 254.

The above electronic devices provide components for an analog-to-digital converter according to an embodiment of the present invention. Other alternatives can also be provided where certain devices are added, one or more devices are removed, or one or more devices are arranged with different connections sequence without departing from the scope of the claims herein. For example, the device 200 includes $2^m$ capacitors. m is an integer larger than zero. As another example, the device 200 includes $2^n$ resistors. n is an integer larger than zero. Future details of the present invention can be found throughout the present specification and more particularly below.

The capacitors 210, 212, 214, 216, 218, 220, 222 and 224 have capacitance values $C_1$, $C_2$, $C_3$, $C_4$, $C_5$, $C_6$, $C_7$ and $C_8$ respectively. The capacitance values $C_1$, $C_2$, $C_3$, $C_4$, $C_5$, $C_6$, $C_7$, and $C_8$ should each equal the same capacitance C. For example, the capacitance C ranges from 10 fF to 1 pF. These capacitors can be connected to one of three voltages 232, 234 and 236. The voltage 232 is set at $V_{s0}$, the voltage 234 is set at $V_{s1}$, and the voltage 236 is set at the ground level $V_{ground}$. For example, $V_{s0}$ ranges from 0.1 V to 4 V. The connections of these capacitors to these three voltages are made independently. For example, the capacitor 212 can be connected to any of the three voltages 232, 234 and 236 regardless of voltages to which the capacitors 210, 214, 216, 218, 220 and 224 are connected. Additionally, the capacitors 210, 212, 214, 216, 218, 220, 222 and 224 can be connected to an input analog voltage $V_{in}$ 280. For example, $V_{in}$ ranges from 0 V to 5 V.

The resistors 240, 242, 244, 246, 248, 250, 252 and 254 should each have the same resistance R. For example, R ranges from 1 KOhm to 10 KOhm. These resistors are linked in series with each other to form a resistor string. The resistor string is placed between the ground level and $V_{s0}$, and can provide the voltage $V_{s1}$ 234. $V_{s1}$ equals $(m/8) V_{s0}$ with a switch (260+2m) closed. For example, if the switch 264 is closed, $V_{s1}$ equals $(2/8) V_{s0}$.

The operational amplifier 226 can compare the input analog voltage $V_{in}$ 280 and an effective reference voltage $V_{eff}$. $V_{eff}$ equals $V_{s0}$ multiplied by an effective capacitance $C_{eff}$. $C_{eff}$ is determined by capacitance of the capacitors 210, 212, 214, 216, 218, 220, 222 and 224 and voltage levels connected to each of these capacitors.

Figure 3:
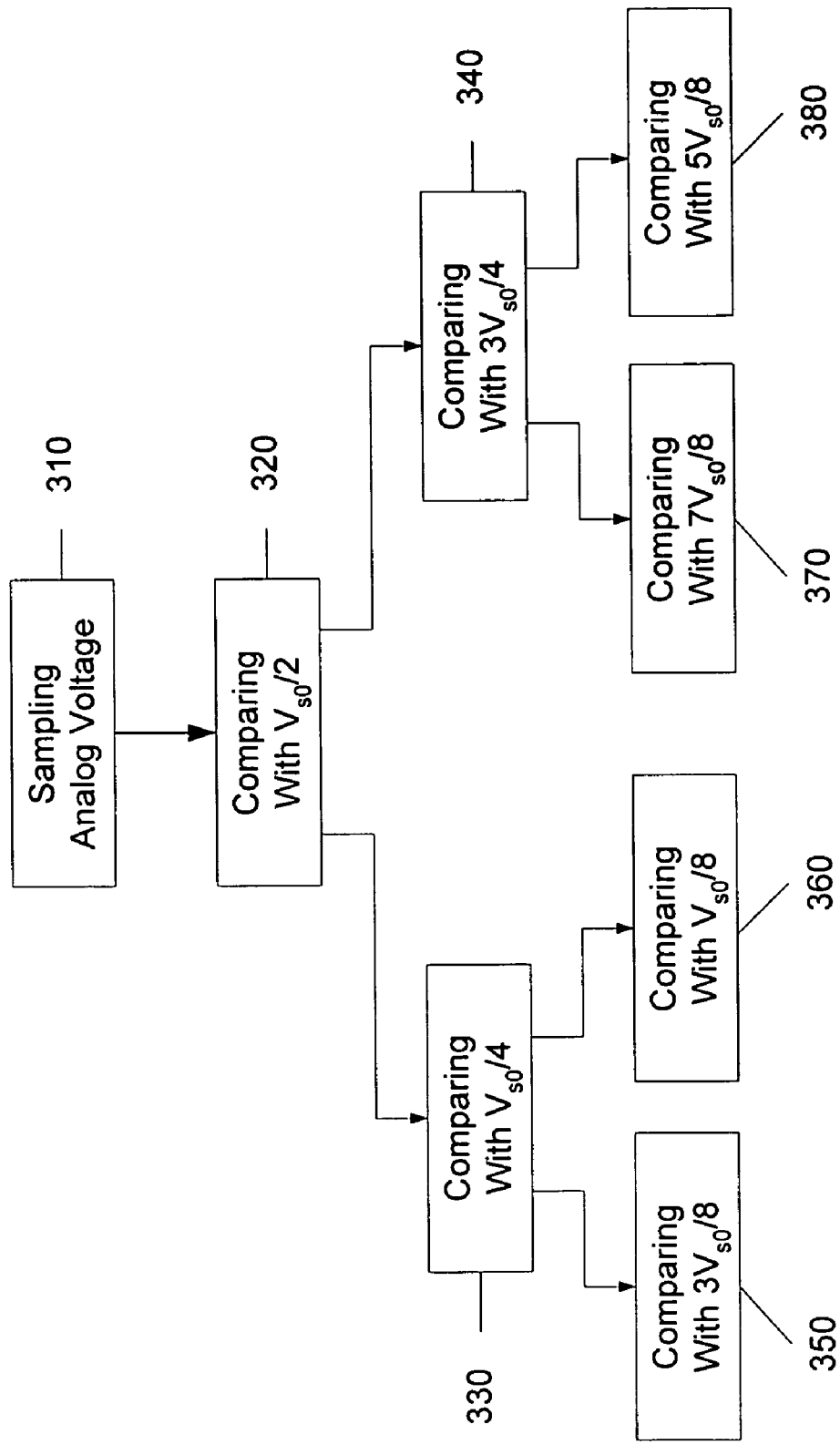
FIG. 3 is a simplified diagram of a method for analog-to-digital conversion according to an embodiment of the present invention.

FIG. 3 is a simplified diagram of a method for analog-to-digital conversion according to an embodiment of the present invention. This diagram is merely an example, which should not unduly limit the scope of the claims herein. The method 300 includes the following processes:
 1. Process 310 for sampling analog voltage;
 2. Process 320 for comparing with $V_{s0}/2$;
 3. Process 330 for comparing with $V_{s0}/4$;
 4. Process 340 for comparing with $3V_{s0}/4$;
 5. Process 350 for comparing with $3V_{s0}/8$;
 6. Process 360 for comparing with $V_{s0}/8$;
 7. Process 370 for comparing with $7V_{s0}/8$;
 8. Process 380 for comparing with $5V_{s0}/8$.

The above processes provide a method according to an embodiment of the present invention. For example, each comparison between $V_{eff}$ and $V_{in}$ determines one bit. During the analog-to-digital conversion process, the determined bits are held by registers. When all the MSBs and LSBs are determined, the analog-to-digital conversion is completed. Other alternatives can also be provided where processes are added, one or more processes are removed, or one or more processes are provided in a different sequence without departing from the scope of the claims herein. Future details of the present invention can be found throughout the present specification and more particularly below.

At the process 310, the input analog voltage $V_{in}$ 280 is sampled at the bottom of the capacitors 210, 212, 214, 216, 218, 220, 222 and 224 with the op-amp 226 closed. The bottom electrodes of the capacitors 210, 212, 214, 216, 218, 220, 222 and 224 are connected to the $V_{in}$ 280.

At the process 320, the $V_{in}$ 280 is compared with $V_{s0}/2$. The capacitors 210, 212, 214 and 216 are connected to the $V_{s0}$ 232, and the capacitors 218, 220, 222 and 224 are connected to the $V_{ground}$ 236. $C_{eff}$ equals the sum of $C_1$, $C_2$, $C_3$ and $C_4$, and $V_{eff}$ equals $V_{s0}/2$ if the capacitance values $C_1$, $C_2$, $C_3$, $C_4$, $C_5$, $C_6$, $C_7$ and $C_8$ each equal the same capacitance C. If $V_{eff}$ is larger than $V_{in}$, the three MSBs are determined as "0xx," and the process 330 is performed. "x" represents an undetermined digits. If $V_{eff}$ is smaller than $V_{in}$, the three MSBs are determined as "1xx," and the process 340 is performed.

At the process 330, the $V_{in}$ 280 is compared with $V_{s0}/4$. The capacitors 210 and 212 are connected to the $V_{s0}$ 232, and the capacitors 214, 216, 218, 220, 222 and 224 are connected to the $V_{ground}$ 236. $C_{eff}$ equals the sum of $C_1$ and $C_2$, and $V_{eff}$ equals $V_{s0}/4$ if the capacitance values $C_1$, $C_2$, $C_3$, $C_4$, $C_5$, $C_6$, $C_7$ and $C_8$ each equal the same capacitance C. If $V_{eff}$ is larger than $V_{in}$, the three MSBs are determined as "00x," and the process 360 is performed. If $V_{eff}$ is smaller than $V_{in}$, the three MSBs are determined as "01x," and the process 350 is performed.

At the process 340, the $V_{in}$ 280 is compared with $3V_{s0}/4$. The capacitors 210, 212, 214, 216, 218 and 220 are connected to the $V_{s0}$ 232, and the capacitors 222 and 224 are connected to the $V_{ground}$ 236. $C_{eff}$ equals the sum of $C_1$, $C_2$, $C_3$, $C_4$, $C_5$ and $C_6$, and $V_{eff}$ equals $3V_{s0}/4$ if the capacitance values $C_1$, $C_2$, $C_3$, $C_4$, $C_5$, $C_6$, $C_7$ and $C_8$ each equal the same capacitance C. If $V_{eff}$ is larger than $V_{in}$, the three MSBs are determined as "10x," and the process 380 is performed. If $V_{eff}$ is smaller than $V_{in}$, the three MSBs are determined as "11x," and the process 370 is performed.

At the process 350, the $V_{in}$ 280 is compared with $3V_{s0}/8$. The capacitors 210, 212 and 214 are connected to the $V_{s0}$ 232, and the capacitors 216, 218, 220, 222 and 224 are connected to the $V_{ground}$ 236. $C_{eff}$ equals the sum of $C_1$, $C_2$ and $C_3$, and $V_{eff}$ equals $3V_{s0}/8$ if the capacitance values $C_1$, $C_2$, $C_3$, $C_4$, $C_5$, $C_6$, $C_7$ and $C_8$ each equal the same capacitance C. If $V_{eff}$ is larger than $V_{in}$, the three MSBs are determined as "010." Additionally, the capacitor 214 is connected to the $V_{s1}$ 234, and a resistor voltage process is performed. $C_{eff}$ equals the sum of $C_1$, $C_2$, and the effective capacitance of the capacitor 214. The effective capacitance of the capacitor 214 equals the capacitance $C_3$ of the capacitor 214 multiplied by m/8 when a switch (260+2m) is closed. If $V_{eff}$ is smaller than $V_{in}$, the three MSBs are determined as "011." Additionally, the capacitor 216 is connected to the $V_{s1}$ 234, and a resistor voltage process is performed. $C_{eff}$ equals the sum of $C_1$, $C_2$, $C_3$, and the effective capacitance of the capacitor 216. The effective capacitance of the capacitor 216 equals the capacitance $C_4$ of the capacitor 216 multiplied by m/8 when a switch (260+2m) is closed. The three LSBs are also determined.

At the process 360, the $V_{in}$ 280 is compared with $V_{s0}/8$. The capacitor 210 is connected to the $V_{s0}$ 232, and the capacitors, 212, 214, 216, 218, 220, 222 and 224 are connected to the $V_{ground}$ 236. $C_{eff}$ equals $C_1$, and $V_{eff}$ equals $V_{s0}/8$ if the capacitance values $C_1$, $C_2$, $C_3$, $C_4$, $C_5$, $C_6$, $C_7$ and $C_8$ each equal the same capacitance C. If $V_{eff}$ is larger than $V_{in}$, the three MSBs are determined as "000." Additionally, the capacitor 210 is connected to the $V_{s1}$ 234, and a resistor voltage process is performed. $C_{eff}$ equals the effective capacitance of the capacitor 210. The effective capacitance of the capacitor 210 equals the capacitance $C_1$ of the capacitor 210 multiplied by m/8 when a switch (260+2m) is closed. The three LSBs are also determined. If $V_{eff}$ is smaller than $V_{in}$, the three MSBs are determined as "001." Additionally, the capacitor 212 is connected to the $V_{s1}$ 234, and a resistor voltage process is performed. $C_{eff}$ equals the sum of $C_1$ and the effective capacitance of the capacitor 212. The effective capacitance of the capacitor 212 equals the capacitance $C_2$ of the capacitor 212 multiplied by m/8 when a switch (260+2m) is closed. The three LSBs are also determined.

At the process 370, the $V_{in}$ 280 is compared with $7V_{s0}/8$. The capacitors 210, 212, 214 216, 218, 220 and 222 are connected to the $V_{s0}$ 232, and the capacitor 224 is connected to the $V_{ground}$ 236. $C_{eff}$ equals the sum of $C_1$, $C_2$, $C_3$, $C_4$, $C_5$, $C_6$ and $C_7$, and $V_{eff}$ equals $7V_{s0}/8$ if the capacitance values $C_1$, $C_2$, $C_3$, $C_4$, $C_5$, $C_6$, $C_7$ and $C_8$ each equal the same capacitance C. If $V_{eff}$ is larger than $V_{in}$, the three MSBs are determined as "110." Additionally, the capacitor 222 is connected to the $V_{s1}$ 234, and a resistor voltage process is performed. $C_{eff}$ equals the sum of $C_1$, $C_2$, $C_3$, $C_4$, $C_5$, $C_6$, and the effective capacitance of the capacitor 222. The effective capacitance of the capacitor 222 equals the capacitance $C_7$ of the capacitor 222 multiplied by m/8 when a switch (260+2m) is closed. The three LSBs are also determined. If $V_{eff}$ is smaller than $V_{in}$, the three MSBs are determined as "111." Additionally, the capacitor 224 is connected to the $V_{s1}$ 234, and a resistor voltage process is performed. $C_{eff}$ equals the sum of $C_1$, $C_2$, $C_3$, $C_4$, $C_5$, $C_6$, $C_7$, and the effective capacitance of the capacitor 224. The effective capacitance of the capacitor 224 equals the capacitance $C_8$ of the capacitor 224 multiplied by m/8 when a switch (260+2m) is closed. The three LSBs are also determined.

At the process 380, the $V_{in}$ 280 is compared with $5V_{s0}/8$. The capacitors 210, 212, 214 216 and 218 are connected to the $V_{s0}$ 232, and the capacitors 220, 222 and 224 are connected to the $V_{ground}$ 236. $C_{eff}$ equals the sum of $C_1$, $C_2$, $C_3$, $C_4$ and $C_5$, and $V_{eff}$ equals $5V_{s0}/8$ if the capacitance values $C_1$, $C_2$, $C_3$, $C_4$, $C_5$, $C_6$, $C_7$ and $C_8$ each equal the same capacitance C. If $V_{eff}$ is larger than $V_{in}$, the three MSBs are determined as "100." Additionally, the capacitor 218 is connected to the $V_{s1}$ 234, and a resistor voltage process is performed. $C_{eff}$ equals the sum of $C_1$, $C_2$, $C_3$, $C_4$, and the effective capacitance of the capacitor 218. The effective capacitance of the capacitor 218 equals the capacitance $C_5$ of the capacitor 218 multiplied by m/8 when a switch (260+2m) is closed. The three LSBs are also determined. If $V_{eff}$ is smaller than $V_{in}$, the three MSBs are determined as "101." Additionally, the capacitor 220 is connected to the $V_{s1}$ 234, and a resistor voltage process is performed. $C_{eff}$ equals the sum of $C_1$, $C_2$, $C_3$, $C_4$, $C_5$, and the effective capacitance of the capacitor 220. The effective capacitance of the capacitor 220 equals the capacitance $C_6$ of the capacitor 220 multiplied by m/8 when a switch (260+2m) is closed. The three LSBs are also determined.

The present invention has various advantages. Certain embodiments of the present invention significantly improve differential non-linearity and monotonicity of output digital codes for an analog-digital converter. Some embodiments of the present invention limit the increase or decrease of the effective capacitor with a change of one Least Significant Bit (LSB). For example, if the output code is 101111, then the corresponding Ceff equal to the sum of $C_1$, $C_2$, $C_3$, $C_4$, $C_5$, and ⅞ of $C_6$. The capacitors 210, 212, 214, 216 and 218 are connected to the $V_{s0}$ 232, and the capacitor 220 is connected to the $V_{s1}$ 234. An increase of one LSB changes the output code to 110000. The corresponding $C_{eff}$ equals the sum of $C_1$, $C_2$, $C_3$, $C_4$, $C_5$, and $C_6$. The capacitors 210, 212, 214, 216, 218 and 220 are connected to the $V_{s0}$ 232. The increase of the last LSB is sequential without capacitor swapping. Some embodiments of the present invention provide an analog-to-digital conversion with improved accuracy to applications related to medium speed and low power consumption.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for converting an analog signal to a digital signal, the apparatus comprising:
   a plurality of capacitors including at least a first capacitor, a second capacitor and a third capacitor, a first capacitor associated with a first capacitance, a second capacitor associated with a second capacitance, a third capacitor associated with a third capacitance, the first capacitance being substantially equal to the second capacitance, the second capacitance being substantially equal to the third capacitance;
   a plurality of resistors including at least a first resistor and a second resistor, the first resistor associated with a first resistance, a second resistor associated with a second resistance, the first resistance being substantially equal to the second resistance;
   an operational amplifier including at least a first input terminal, a second input terminal and an output terminal;
   wherein the first capacitor includes a first capacitor terminal and a second capacitor terminal, the second capacitor includes a third capacitor terminal and a fourth capacitor terminal, the third capacitor includes a fifth capacitor terminal and a sixth capacitor terminal, and the first capacitor terminal, the third capacitor terminal, and the fifth capacitor terminal are coupled to the first input terminal;
   wherein the second input terminal is coupled to a first voltage;
   wherein each of the second capacitor terminal, the fourth capacitor terminal, and the sixth capacitor terminal is capable of being coupled to anyone of the first voltage, an analog voltage, a second voltage, and a third voltage, the analog voltage associated with the analog signal;

wherein the first resistor includes a first resistor terminal and a second resistor terminal, the second resistor includes a third resistor terminal and a fourth resistor terminal, the first resistor terminal is coupled to the second voltage, the fourth resistor terminal is coupled to the first voltage, the first resistor and the second resistor being in series;

wherein the plurality of resistors corresponds to a plurality of resistor terminals, each of the plurality of resistors including two of the plurality of resistor terminals;

wherein the third voltage is provided by opening or closing a plurality of switches, each of the plurality of switches directly coupled to one of the plurality of resistor terminals;

wherein the apparatus is configured to convert the analog signal to the digital signal and is associated with a process related to a successive approximation register;

wherein the process includes processing information associated with the analog voltage and a fourth voltage; adjusting the fourth voltage in response to information associated with the analog voltage and the fourth voltage, and determining the digital signal based on at least information associated with the fourth voltage;

wherein the fourth voltage is associated with at least a first voltage level of the second capacitor terminal, a second voltage level of the fourth capacitor terminal and a third voltage level of the sixth capacitor terminal, the first voltage level, the second voltage level and the third voltage level each being selected from a group consisting of the first voltage, the second voltage and the third voltage.

2. The apparatus of claim 1 wherein the first voltage is at the ground level.

3. An apparatus for converting an analog signal to a digital signal, the apparatus comprising:

a plurality of capacitors including at least a first capacitor and a second capacitor, a first capacitor associated with a first capacitance, a second capacitor associated with a second capacitance, the first capacitance being substantially equal to the second capacitance;

a plurality of resistors including at least a first resistor and a second resistor, the first resistor associated with a first resistance, a second resistor associated with a second resistance, the first resistance being substantially equal to the second resistance;

an operational amplifier including at least a first input terminal, a second input terminal and an output terminal;

wherein the first capacitor includes a first capacitor terminal and a second capacitor terminal, the second capacitor includes a third capacitor terminal and a fourth capacitor terminal, and the first capacitor terminal and the third capacitor terminal are coupled to the first input terminal;

wherein the second input terminal is coupled to a first voltage;

wherein each of the second capacitor terminal and the fourth capacitor terminal is capable of being coupled to anyone of the first voltage, an analog voltage, a second voltage, and a third voltage, the analog voltage associated with the analog signal;

wherein the first resistor includes a first resistor terminal and a second resistor terminal, the second resistor includes a third resistor terminal and a fourth resistor terminal, the first resistor terminal is coupled to the second voltage, the fourth resistor terminal is coupled to the first voltage, the first resistor and the second resistor being in series;

wherein the plurality of resistors corresponds to a plurality of resistor terminals, each of the plurality of resistors including two of the plurality of resistor terminals;

wherein the third voltage is provided by opening or closing a plurality of switches, each of the plurality of switches directly coupled to one of the plurality of resistor terminals;

wherein the apparatus is configured to convert the analog signal to the digital signal and is associated with a process related to a successive approximation register;

wherein the process includes coupling the second capacitor terminal and the fourth capacitor terminal to the analog voltage, processing information associated with the analog voltage and a fourth voltage, adjusting the fourth voltage in response to information associated with the analog voltage and the fourth voltage, and determining the digital signal based on at least information associated with the fourth voltage;

wherein the fourth voltage is associated with at least a first voltage level of the second capacitor terminal and a second voltage level of the fourth capacitor terminal; the first voltage level and the second voltage level each being selected from a group consisting of the first voltage, the second voltage and the third voltage.

4. The apparatus of claim 3 wherein the first voltage is at the ground level.

5. The apparatus of claim 3 wherein the plurality of capacitors is associated with a plurality of capacitances each of the plurality of capacitances being substantially the same.

6. The apparatus of claim 5 wherein the plurality of capacitors is associated wit a plurality of capacitor terminals, each of the plurality of capacitor terminals is capable of being coupled to anyone of the first voltage, the analog voltage, the second voltage, and the third voltage.

7. The apparatus of claim 6 wherein the plurality of capacitor terminals does not include the first capacitor terminal and the third capacitor terminal.

8. The apparatus of claim 7 wherein each of the plurality of capacitor terminals is coupled to the third voltage.

9. The apparatus of claim 7 wherein the plurality of resistors is associated with a plurality of resistances, each of the plurality of resistances being substantially the same.

10. The apparatus of claim 9 wherein the plurality of resistors are in series.

11. The apparatus of claim 10 wherein the plurality of resistors is associated with a plurality of voltages, the plurality of voltages including the second voltage and the first voltage, the plurality of voltages associated with a connection between any two of the plurality of resistors.

12. The apparatus of claim 11 wherein the third voltage is capable of being coupled to anyone of the plurality of voltages.

13. A method for converting an analog signal to a digital signal, the method comprising:

providing an apparatus for converting the analog signal to the digital signal, the apparatus including:

a plurality of capacitors associated with a plurality of capacitances, each of the plurality of capacitances being substantially equal;

a plurality of resistors in series and associated with a plurality of resistances, each of the plurality of resistances being substantially equal;

wherein the plurality of capacitors is associated with a first plurality of capacitor terminals and a second plurality of capacitor terminals, the first plurality of capacitor terminals is coupled to each other, each of the second plurality of capacitor terminals is capable of being coupled to anyone of a first voltage, an analog voltage, a second voltage, and a third voltage, the analog voltage associated with the analog signal;

wherein the plurality of resistors is associated with a plurality of resistor terminals, a first terminal of the plurality of resistor terminals is coupled to the second voltage, a second terminal of the plurality of resistor terminals is coupled to the first voltage, each of the plurality of resistors including two of the plurality of resistor terminals;

wherein the third voltage is provided by opening or closing a plurality of switches, each of the plurality of switches directly coupled to one of the plurality of resistor terminals;

coupling each of the second plurality of capacitor terminals to the analog voltage;

decoupling each of the second plurality of capacitor terminals from the analog voltage;

coupling each of the second plurality of capacitor terminals to one selected from a group consisting of the first voltage, the second voltage, and the third voltage, the second plurality of capacitor terminals associated with a plurality of capacitor voltage levels respectively;

processing information associated with the analog voltage and a fourth voltage, the fourth voltage associated with the plurality of capacitor voltage levels;

adjusting the fourth voltage in response to information associated with the analog voltage and the fourth voltage;

determining the digital signal based on at least information associated with the fourth voltage.

14. The method of claim 13 wherein the first voltage is at the ground level.

15. The method of claim 13 wherein the processing information associated with the analog voltage and a fourth voltage is related to a successive approximation register.

16. The method of claim 15, and further comprising:
adjusting a capacitor voltage level for each of the second plurality of capacitor terminals to one selected from a group consisting of the first voltage, the second voltage, and the third voltage response to information associated with the analog voltage and the fourth voltage;

coupling the third voltage to one of the plurality of resistor terminals free from the second terminal in response to information associated with the analog voltage and the fourth voltage.

17. The method of claim 16 wherein the plurality of capacitors comprises $2^m$ capacitors, wherein m is an integer larger than zero.

18. The method of claim 17 wherein the coupling each of the second plurality of capacitor terminals comprises coupling $2^{m-1}$ capacitors to the second voltage and coupling the other $2^{m-1}$ capacitors to the first voltage.

19. The method of claim 18 wherein the processing information associated with the analog voltage and a fourth voltage and adjusting the fourth voltage comprises
if the fourth voltage is larger than the analog voltage, coupling $2^{m-2}$ capacitors to the second voltage and coupling the other $2^m - 2^{m-2}$ capacitors to the first voltage, m being larger than 1.

20. The method of claim 19 wherein the processing information associated with the analog voltage and a fourth voltage and adjusting the fourth voltage comprises
if the fourth voltage is smaller than the analog voltage, coupling $2^{m-2}$ capacitors to the first voltage and coupling the other $2^m - 2^{m-2}$ capacitors to the second voltage.

* * * * *